United States Patent
Ahn et al.

(10) Patent No.: US 6,461,911 B2
(45) Date of Patent: Oct. 8, 2002

(54) SEMICONDUCTOR MEMORY DEVICE AND FABRICATING METHOD THEREOF

(75) Inventors: Tae-hyuk Ahn, Yongin; Sang-sup Jeong, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 4 days.

(21) Appl. No.: 09/808,983

(22) Filed: Mar. 16, 2001

(65) Prior Publication Data

US 2001/0046737 A1 Nov. 29, 2001

(30) Foreign Application Priority Data

May 26, 2000 (KR) ......................................... 2000-28658

(51) Int. Cl.$^7$ ......................................... H01L 21/8242
(52) U.S. Cl. ...................... 438/253; 438/241; 438/396; 257/298; 257/308; 257/311
(58) Field of Search ............................... 438/241, 253, 438/258, 396; 257/68, 296, 303, 306, 311, 298, 300, 301, 304, 307, 308

(56) References Cited

U.S. PATENT DOCUMENTS

| | | | | |
|---|---|---|---|---|
| 5,981,369 A | * | 11/1999 | Yoshida et al. | 438/597 |
| 6,258,649 B1 | * | 7/2001 | Nakamura et al. | 438/238 |
| 6,291,289 B2 | * | 9/2001 | Rhodes et al. | 438/239 |
| 6,215,144 B1 | * | 4/2002 | Saito et al. | 257/310 |

\* cited by examiner

*Primary Examiner*—Long Pham
*Assistant Examiner*—Fernando Toledo
(74) *Attorney, Agent, or Firm*—Volentine Francos, PLLC

(57) ABSTRACT

A semiconductor memory device and a fabricating method thereof are provided. In the course of forming a buried contact hole after forming a bit line pattern, the buried contact hole is formed by a self aligned contact process using capping layers included in the bit line pattern, thereby securing an overlap margin. Formation of a deep inner cylinder type capacitor unit prevents a bridge defect between lower electrodes of the capacitor and suppresses the occurrence of particles while simplifying the fabrication process. Furthermore, a mechanism for forming a second metal contact hole can simplifies the problems related to etching and filling of the second metal contact hole.

21 Claims, 15 Drawing Sheets

SEMICONDUCTOR MEMORY DEVICE AND FABRICATING METHOD THEREOF

BACKGROUND OF THE INVENTION

The present application claims priority under 35 U.S.C. §119 to Korean Application No. 2000-28658 filed on May 26, 2000, which is hereby incorporated by reference in its entirety for all purposes.

1. Field of the Invention

The present invention relates to a semiconductor memory device and a fabricating method thereof, and more particularly, to a dynamic random access memory (DRAM) device and a fabricating method thereof.

2. Description of the Related Art

When manufacturing highly integrated DRAM devices, problems can occur in each step of a process for manufacturing the semiconductor memory devices. In order to alleviate such problems, materials of semiconductor memory devices can be changed and new design techniques can be adopted in the integration schemes thereof. There are many types of integration schemes in which new design techniques are adopted. Most recently, representative integration schemes in a process for manufacturing DRAM devices for which a design rule of below 0.17 μm is used, include an isolation layer manufactured by a shallow trench isolation (STI) process, a contact hole manufactured by a self-aligned contact (SAC) technique, a cylinder type capacitor, and a dielectric layer having a $Ta_2O_5$ structure.

However, DRAM devices in which the above integration schemes are adopted may encounter the following problems. First, in the case of using a SAC process and a cylinder type capacitor, it is difficult to secure an appropriate process margin, and stability of the process may be degraded. In particular, a cylinder type capacitor adopted in order to improve the capacitance of DRAM devices can suffer from a bridge defect between adjacent bits due to the narrow intervals between nodes of each cylinder type capacitor. Second, a wet strip process for removing a thick interlayer dielectric layer such as an oxide layer required for forming a cylinder type capacitor causes many defects and further complicates fabrication. Thirdly, the step difference between core and cell areas caused by the use of a cylinder type capacitor, requires a thick insulating layer for planarization. Thus, when a metal contact is formed on a core area, there are difficulties encountered in a process of filling the metal contact hole with a conductive material, as well as in forming a metal contact hole in the thick interlayer dielectric layer for planarization.

SUMMARY OF THE INVENTION

The present invention is therefore directed to a semiconductor memory device and fabricating method thereof that substantially overcome one or more of the problems due to the limitations and disadvantages of the related art.

To solve the above problems, it is an objective of the present invention to provide a method of fabricating a semiconductor memory device, which is capable of securing a process margin between a bit line pattern and a buried contact hole, preventing the occurrence of a bridge defect between nodes when forming a cylinder type capacitor, suppressing the occurrence of particles, simplifying the fabrication process, and appropriately forming a deep-structured metal contact on a core area.

It is another objective of the present invention to provide a semiconductor memory device using the above fabricating method.

Accordingly, to solve the above objectives, the present invention provides a method of manufacturing a semiconductor memory device including a core area and a cell area. According to the method, first, a gate pattern having capping layers is formed on a semiconductor substrate on which an isolation layer has been formed. Then, a first interlayer dielectric layer is formed on the semiconductor substrate and the gate pattern, and is then patterned to form a direct contact pad and a buried contact pad. A second interlayer dielectric layer is formed on this structure and then a bit line pattern having capping layers is formed in the cell area. A third interlayer dielectric layer is then formed thereon, a buried contact hole connected to the buried contact pad is formed in the cell area by a self aligned contact process, and a buried contact plug for filling the buried contact hole is formed. An etching stopper is then formed on the structure, a first metal contact hole is formed in the core area, and a first metal plug for filling the first metal contact hole is formed. A fourth interlayer dielectric layer is formed on the etching stopper and then patterned to form a fourth interlayer dielectric pattern having a groove which exposes the buried contact plug in the cell area and which exposes the surface of the third interlayer dielectric layer in the core area. A polysilicon layer for a lower electrode is stacked along a step difference of the surface of the fourth interlayer dielectric pattern, and then is selectively removed. A dielectric layer is formed on the polysilicon layer for a lower electrode, and an upper electrode pattern is then formed on the structure so that an upper electrode layer in the core area and an upper electrode layer in the cell area may be connected together. A fifth interlayer dielectric layer is formed on the structure and then a contact hole for wiring that exposes the upper electrode layer in the groove in the core area and a second metal contact hole that exposes the first metal plug are formed. Finally, a contact plug for wiring that fills the contact hole for wiring and a second metal plug that fills the second metal contact hole are formed.

The present invention also provides a method of manufacturing a semiconductor memory device including a core area and a cell area according to another aspect of the present invention. According to the method, first, a gate pattern including capping layers is formed on a semiconductor substrate on which an isolation separation layer has been formed. A first interlayer dielectric layer is formed on the semiconductor substrate and the gate pattern, and is then patterned to form a direct contact pad and a buried contact pad. A second interlayer dielectric layer is formed on this structure, and a bit line pattern having capping layers is formed in the cell area. A third interlayer dielectric layer is then formed thereon, a buried contact hole connected to the buried contact pad is formed by a self aligned contact process in the cell area, and a buried contact plug for filling the buried contact hole is formed. An etching stopper is then formed on the structure, a first metal contact hole is formed in the core area, and a first metal plug for filling the first metal contact hole is formed. A fourth interlayer dielectric pattern which overlies the entire surface of the core area is then formed to include a concave opening that exposes the buried contact plug in the cell area. A polysilicon layer for a lower electrode is stacked along a step difference of the surface of the fourth interlayer dielectric pattern in the cell area, and is then selectively removed. A dielectric layer is formed on the polysilicon layer for a lower electrode. An upper electrode pattern which is connected together in the cell area of the semiconductor substrate and extended to a portion of the core area is formed. A fifth interlayer dielectric layer is formed on the structure, and then a contact hole for wiring that exposes a portion of the upper electrode pattern extended to the core area and a second metal contact hole that exposes the first metal plug are formed. Finally, a contact plug for wiring that fills the contact hole for wiring and a second metal plug that fills the second metal contact hole are formed.

The isolation layer may be formed by a shallow trench isolation process, and the bit line pattern may be formed by sequentially stacking a titanium layer, a barrier layer, and a tungsten layer. The gate pattern and the bit line pattern further may include capping layers composed of insulating layers on top of the gate pattern and the bit line pattern and spacers along the sidewalls thereof. The capping layers may be formed of a nitride layer.

The etching stopper may be formed of a nitride layer. After forming the etching stopper, the step of forming a sacrificial oxide layer on the etching stopper may proceed. The first metal plug may contact an active region, a bit line pattern, and a word line, as seen from the top view of the cell area. The diameter of the second metal plug may be larger than that of the first metal plug.

The buried contact plug may connect with the buried contact pad at a position below the insulating layer formed at the top of the gate pattern, as seen from a cross-sectional view of the word line on the cell area, and the polysilicon layer for a lower electrode may connect with the buried contact plug at the position below the insulating layer formed at the top of the bit line pattern, as seen from a cross-sectional view of the bit line on the cell area.

The present invention also provides a semiconductor memory device including a core area and a cell area. The semiconductor memory device includes a semiconductor substrate including an isolation layer formed by shallow trench isolation, a gate pattern having capping layers and which is formed on the semiconductor substrate, a bit line pattern having capping layers formed at the sidewalls and top thereof, wherein first and second interlayer dielectric layers are formed between the bit line pattern and the gate pattern, a buried contact plug for filling a buried contact hole formed by a self-aligned contact process using the capping layers on the cell area after forming a third interlayer dielectric layer on the bit line pattern, an etching stopper provided over the third interlayer dielectric layer through which the buried contact plug is formed, a first metal plug connected to the surface of the semiconductor substrate and the gate pattern by patterning the etching stopper and the first, second, and third interlayer dielectric layers in the core area, a fourth interlayer insulating pattern provided over the etching stopper through which the first metal plug has been formed and which exposes the buried contact plug in the cell area and has a groove exposing a portion of the third interlayer dielectric layer in the core area, a deep inner cylinder type capacitor unit formed along a step difference on the surface of the fourth interlayer insulating pattern, a second metal plug which is connected to the first metal plug in a fifth interlayer dielectric layer in the core area formed on the structure including the deep inner cylinder type capacitor and which has a diameter larger than that of the first metal plug, and a contact plug for wiring which is connected to the upper electrode layer of the deep inner cylinder type capacitor unit in the groove of the fourth interlayer dielectric pattern.

The present invention also provides a semiconductor memory device including a core area and a cell area according to another aspect of the present invention. The semiconductor memory device includes a substrate including an isolation layer formed by shallow trench isolation, a gate pattern including capping layers and which is formed on the semiconductor substrate, a bit line pattern including capping layers, wherein first and second interlayer dielectric layers are formed between the bit line pattern and the gate pattern, a buried contact plug for filling a buried contact hole formed by a self-aligned contact process using the capping layers in the cell area after forming a third interlayer dielectric layer on the bit line pattern, an etching stopper provided over the third interlayer dielectric layer through which the buried contact plug is formed, a first metal plug connected to the surface of semiconductor substrate and the gate pattern by patterning the etching stopper and the first, second, and third interlayer dielectric layers in the core area, a fourth interlayer insulating pattern which is provided over the etching stopper through which the first metal plug has been formed and which exposes the buried contact plug in the cell area, a deep inner cylinder type capacitor unit formed along a step difference on the surface of the fourth interlayer insulating pattern, a second metal plug which is connected to the first metal plug in a fifth interlayer dielectric layer in the core area formed on the structure including the deep inner cylinder type capacitor and which has a diameter larger than that of the first metal plug, and a contact plug for wiring which is connected to the upper electrode layer of the deep inner cylinder type capacitor unit through the fifth interlayer dielectric layer in the core area including the deep inner cylinder type capacitor.

According to the present invention, a buried contact hole is formed by a self-aligned contact (SAC) process using the capping layer of a bit line, thereby securing a process margin between the bit line pattern and the buried contact hole. Furthermore, the invention forms a deep inner cylinder type capacitor to prevent a bridge defect between nodes and to suppress the occurrence of particles, while simplifying the fabrication process. In addition, a second metal contact hole is formed with a diameter larger than the underlying first metal contact hole using an etching stopper, so that the second metal contact hole having a deep structure is appropriately etched and the etched second metal contact hole can be filled with a conductive material.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A first embodiment for forming a contact hole for wiring on an upper electrode layer overlying a groove of a core area is described with reference to FIGS. 1–15. Referring to FIGS. 1–15, in each drawing, the left portion is a cross section of a semiconductor substrate on a core area in the word line direction, the middle portion is a cross section of a semiconductor substrate on a cell area in the word line direction, and the right portion is a cross section of a semiconductor substrate on a cell area in the bit line direction. Although FIG. 1 consists of three different cross sections, these cross sections are expressed in one drawing to aid in understanding. Particularly, it should be understood that gate pattern 110 and bit line pattern 130 may be formed perpendicular with respect to each other, as illustrated and described subsequently with respect to FIG. 7, although not necessarily limited thereto.

Figure 13:
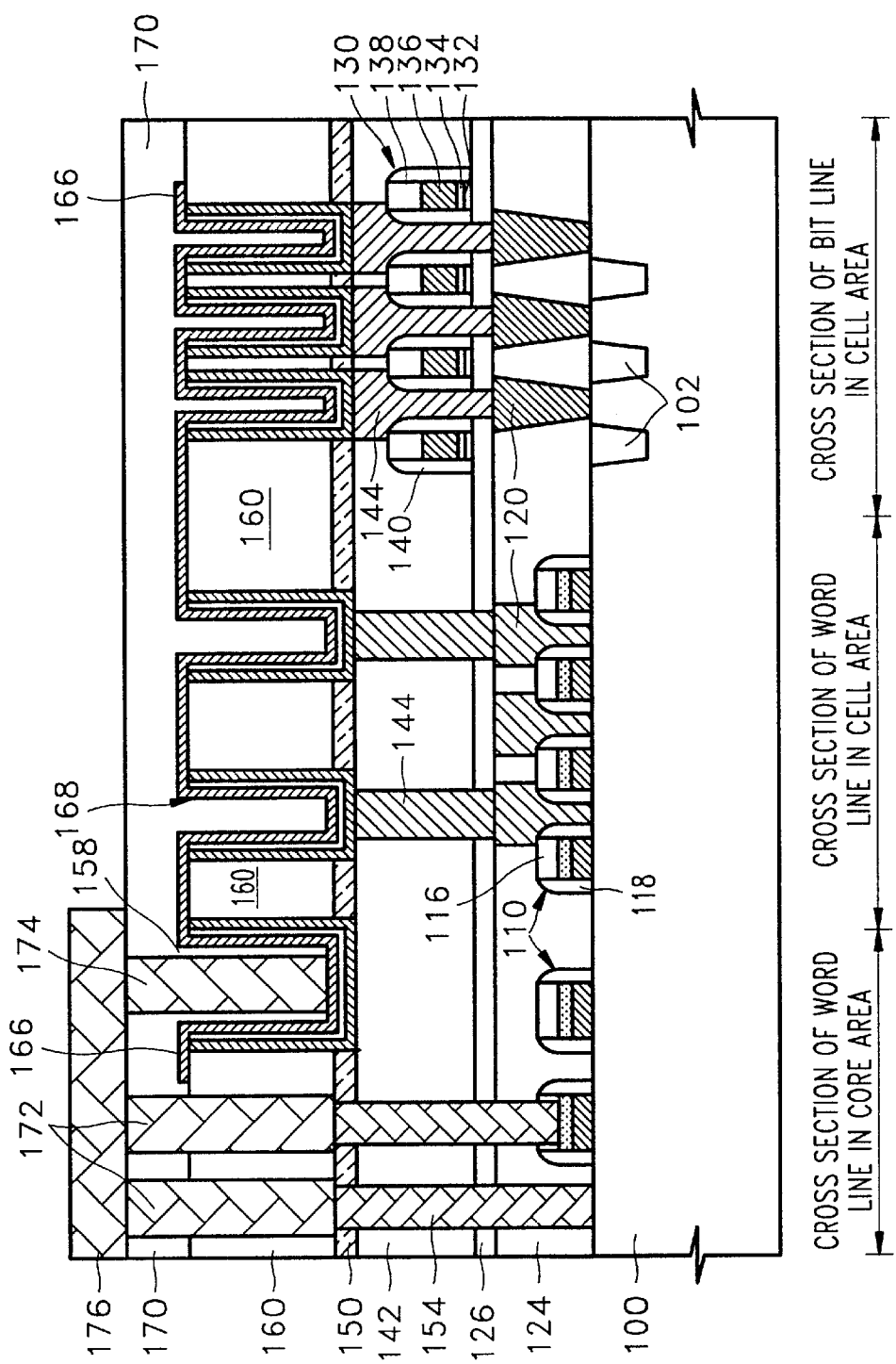

First, referring to FIG. 13, a semiconductor memory device according to a first embodiment of the present invention includes i) a semiconductor substrate 100 including isolation layers 102 formed by a shallow trench isolation (STI) process, ii) a gate pattern 110 having capping layers 116 and 118, which is formed on the semiconductor substrate 100, iii) a bit line pattern 130 having capping layers 138 and 140, wherein first and second interlayer dielectric layers 124 and 126 are formed between the bit line pattern 130 and the gate pattern 110, iv) a buried contact plug 144 for filling a buried contact hole formed by a self-aligned contact (SAC) process using the capping layers 138 and 140, after forming a third interlayer dielectric layer 142 on the bit line pattern 130, v) an etching stopper 150 formed on the third interlayer dielectric layer 142 through which the buried contact plug 144 has been formed, vi) a first metal plug 154 connected to the surface of the semiconductor substrate 100 and the gate pattern 110 by patterning the etching stopper 150 and the first, second and third interlayer dielectric layers 124, 126, and 142 on the core area, vii) a fourth interlayer dielectric pattern 160 having grooves 158 which expose the buried contact plug 144 of the cell area and a portion of the third interlayer dielectric layer 142 of the core area through which the first metal plug 154 has been formed, viii) a deep inner cylinder type capacitor unit 168 formed along the step difference of the surface of the fourth interlayer dielectric pattern 160, ix) a second metal plug 172 which is connected to the first metal plug through a fifth interlayer dielectric layer 170 of the core area formed on the deep inner cylinder type capacitor unit 168, and which has a diameter larger than the first metal plug 154, and x) a contact plug for wiring 174 which is connected to an upper electrode layer 166 of the deep inner cylinder type capacitor unit 168, and which is formed in the groove 158 of the fourth interlayer dielectric pattern 160.

In the case of the semiconductor memory device according to the first embodiment of the present invention, due to the buried contact plug 144 formed by the SAC process using the capping layers 138 and 140 of the bit line pattern 130, an overlap margin can be secured in manufacturing a semiconductor memory device having a minute pattern. Furthermore, since the fourth interlayer dielectric pattern 160 is not removed by wet etching for forming the deep inner cylinder type capacitor unit 168, this not only suppresses a bridge defect between lower electrodes of the capacitor and the occurrence of particles, but also simplifies the fabrication process. Finally, a mechanism for forming the second metal contact plug 172 can overcome restrictions of the etching and filling of the second metal contact plug 172 although the step difference between the cell area and the core area is increased.

Figure 1:
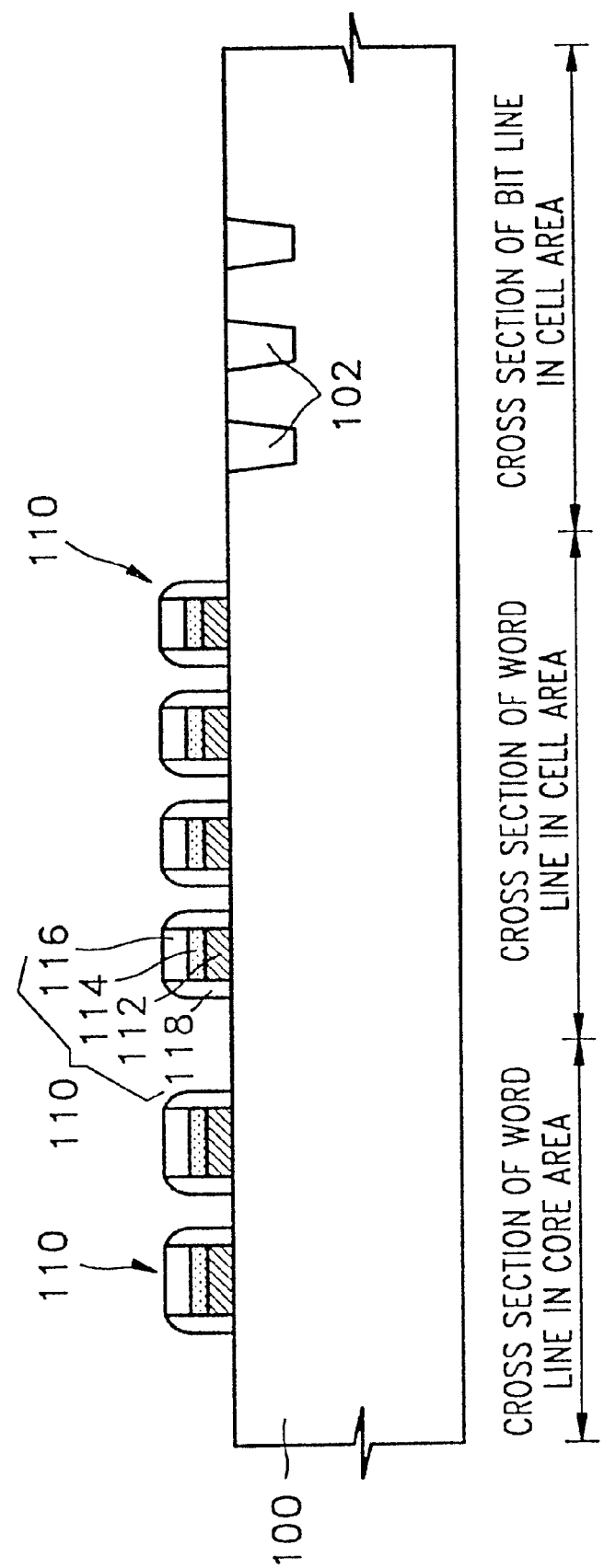
FIGS. 1–4 illustrate a semiconductor memory device and a fabricating method thereof according to a first embodiment of the present invention.

Next, a method of fabricating a semiconductor memory device such as in FIG. 13, will now be described with reference to FIGS. 1–15. FIG. 1 illustrates a cross sectional view of a substrate with an isolation layer and a gate pattern formed. Referring to FIG. 1, isolation layers 102 are formed on a semiconductor substrate 100 by a STI process. After a gate insulating layer (not shown) is formed, a gate pattern 110 is formed on the semiconductor substrate 100. To form the gate pattern 110, a gate electrode 112 comprised of polysilicon, a silicide layer 114, and a gate upper insulating layer 116 are stacked sequentially on the semiconductor substrate 100 to pattern the same. Subsequently, an insulating layer (not shown) for forming a gate spacer is formed to a predetermined thickness and then the insulating layer is anisotropically etched to form a gate spacer 118 along the sidewall of the patterned gate electrode 112, silicide layer 114 and gate upper insulating layer 116, thereby completing the gate pattern 110. The gate upper insulating layer 116 and the gate spacer 118 may be formed using a nitride layer. In the present invention, capping layers of the gate pattern include the gate upper insulating layer 116 and the gate spacer 118.

Figure 2:
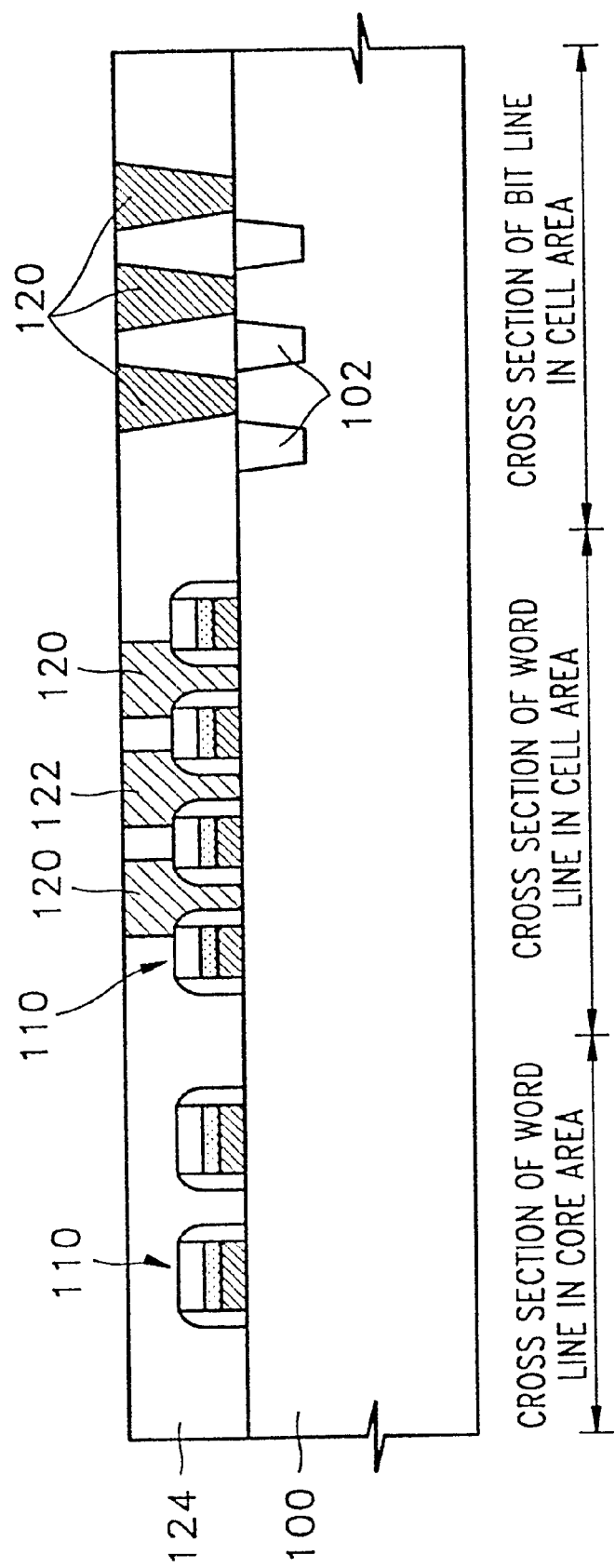

FIG. 2 illustrates a cross sectional view of a semiconductor substrate after direct contact pads and a buried contact pads are formed on the semiconductor substrate of FIG. 1. Referring to FIG. 2, after a first interlayer dielectric layer 124 is provided on the semiconductor substrate 100 on which the gate pattern 110 has been formed, etchback or chemical mechanical polishing (CMP) is performed to planarize the surface of the first interlayer dielectric layer 124. In order to prevent thermal diffusion of impurities and to suppress profile distortion in a subsequent cleaning process, it is suitable to form the first interlayer dielectric layer 124 of a high density plasma (HDP) oxide layer by a chemical vapor deposition (CVD) technique.

A photolithography process is performed on the planarized semiconductor substrate 100 to form a contact hole for forming the direct contact pad 122 and buried contact pads 120. This etching is performed by means of a SAC process due to the capping layers of the gate pattern 110. Subsequently, after depositing a polysilicon layer which overlies the semiconductor substrate 100 and fills the contact hole, etchback is performed to planarize the surface of the polysilicon layer, thereby forming the direct contact pad 122 and the buried contact pads 120 which are comprised of polysilicon.

Figure 3:
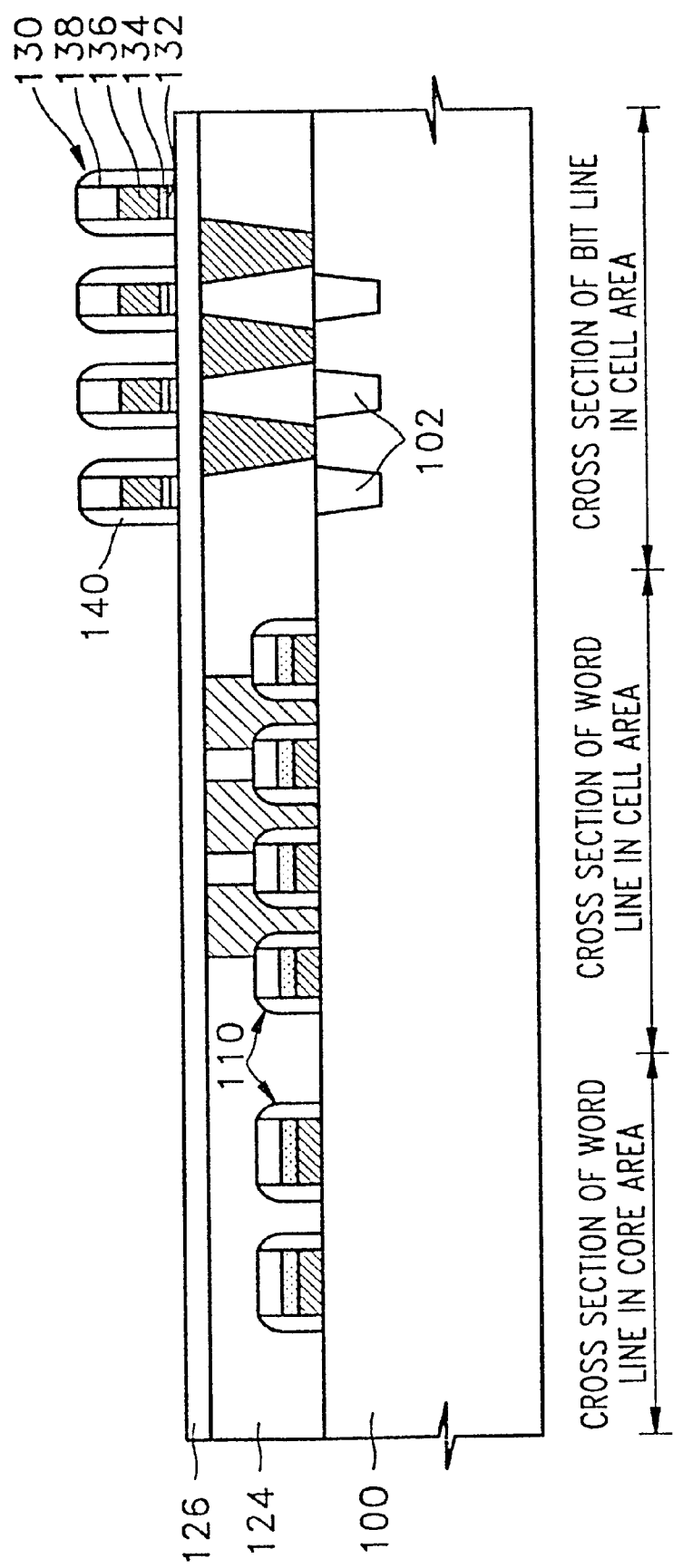

FIG. 3 is a cross sectional view of a semiconductor substrate after a bit line pattern is formed on the semiconductor substrate of FIG. 2. Referring to FIG. 3, a second interlayer dielectric layer 126 is formed of a HDP oxide layer on the first interlayer dielectric layer 124 through which the direct contact pad 122 and the buried contact pads 120 have been formed. Then, the bit line pattern 130 is formed on the second interlayer dielectric layer 126. According to a method of forming a bit line pattern 130, first, a titanium silicide layer is formed of a titanium layer 132 in order to improve the speed characteristic of a semiconductor device, and then a barrier layer 134 of titanium nitride (TiN) is formed on the titanium layer 132. Subsequently, a tungsten layer 136, which is a conductive material for a bit line is formed on barrier layer 134, and then a bit line upper insulating layer 138 of a nitride layer is formed on the tungsten layer 136. Thereafter, using the bit line upper insulating layer 138 as an etching mask, the underlying tungsten layer 136, the barrier layer 134, and the titanium layer 132 are patterned and bit line spacers 140 are formed along both the patterned sidewalls using a nitride layer, thereby completing the bit line pattern 130. Capping layers of the bit line pattern 130 include the bit line upper insulating layer 138 and the bit line spacer 140, both of which are formed of a nitride layer.

The bit line upper insulating layer 138 may be formed of a nitride layer by plasma enhanced chemical vapor deposition (PECVD), which can be performed at a low temperature, such as 200–400° C. This is because, if a nitride layer is formed using a hot temperature process, lifting may occur on the interface between the underlying barrier layer 134 and titanium layer 132, and between the titanium layer 132 and the second interlayer dielectric layer 126. However, lifting of the tungsten layer 136 does not occur after patterning the bit line upper insulating layer 138, the tungsten layer 136, the barrier layer 134, and the titanium layer 132, so that the bit line spacers 140 can be formed of a nitride layer by low pressure CVD (LPCVD) without restrictions of temperature for formation.

Figure 4:
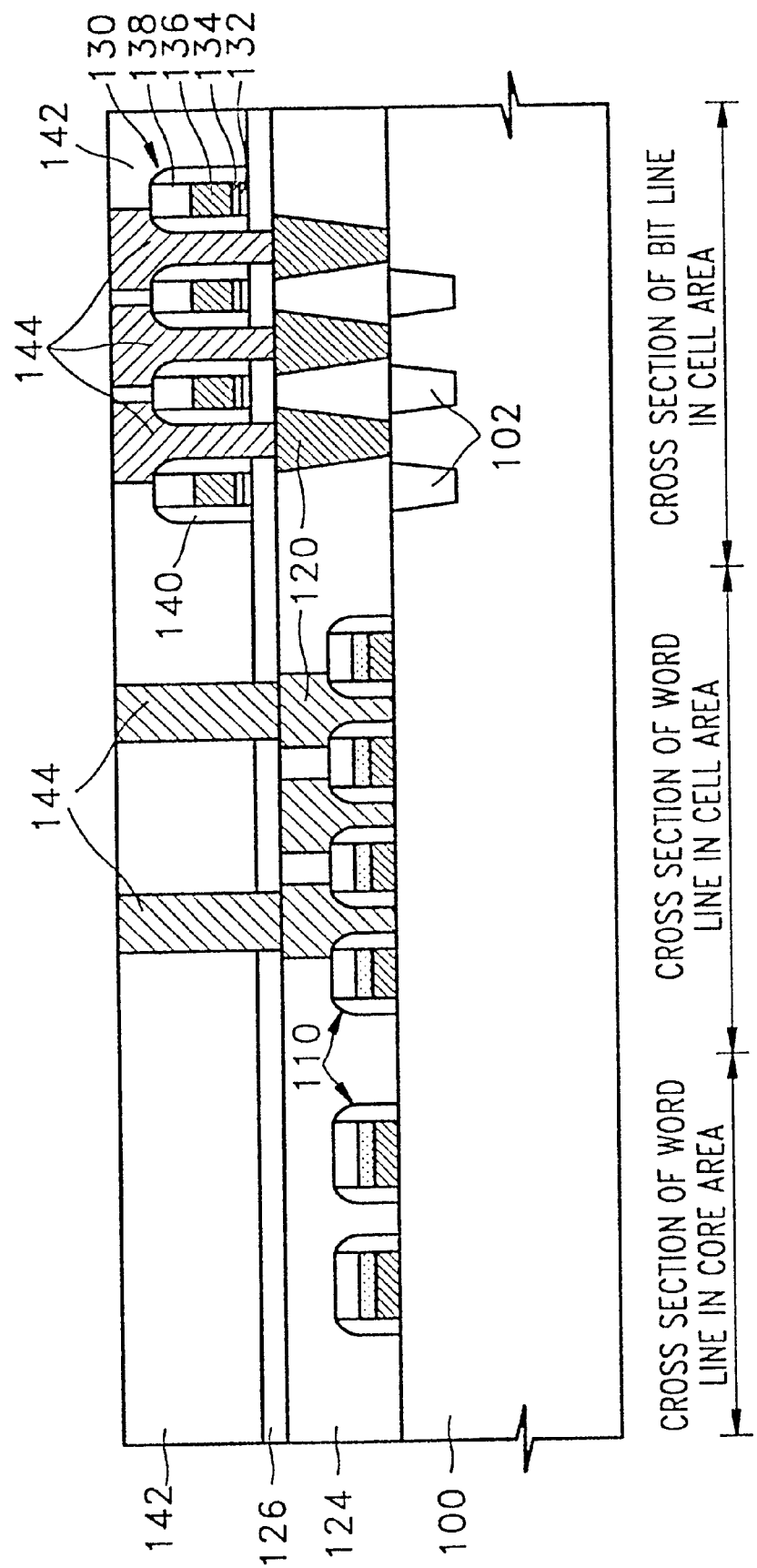

FIG. 4 is a cross sectional view of a semiconductor substrate after a buried contact plug is formed in the device as in FIG. 3. Referring to FIG. 4, a third interlayer dielectric layer 142 is formed on the second interlayer dielectric layer 126 and on the bit line pattern 130 has been formed. The third interlayer dielectric layer 142 may be a HDP oxide layer that can be formed at a low temperature. Subsequently, CMP is performed to planarize the surface of the third interlayer dielectric layer 142. Patterning is performed on the third interlayer dielectric layer 142, thereby forming buried contact holes that expose the buried contact pads 120 by a SAC process. Subsequently, a polysilicon layer is provided on the resulting material, and then a etchback process is performed to form buried contact plugs 144 for filling the buried contact hole.

Hereinafter, a conventional buried contact plug process and the buried contact plug process of the present invention will be compared, and the distinctive features of a buried contact plug according to the present invention, will now be described with reference to FIGS. 5–7.

Figure 5:
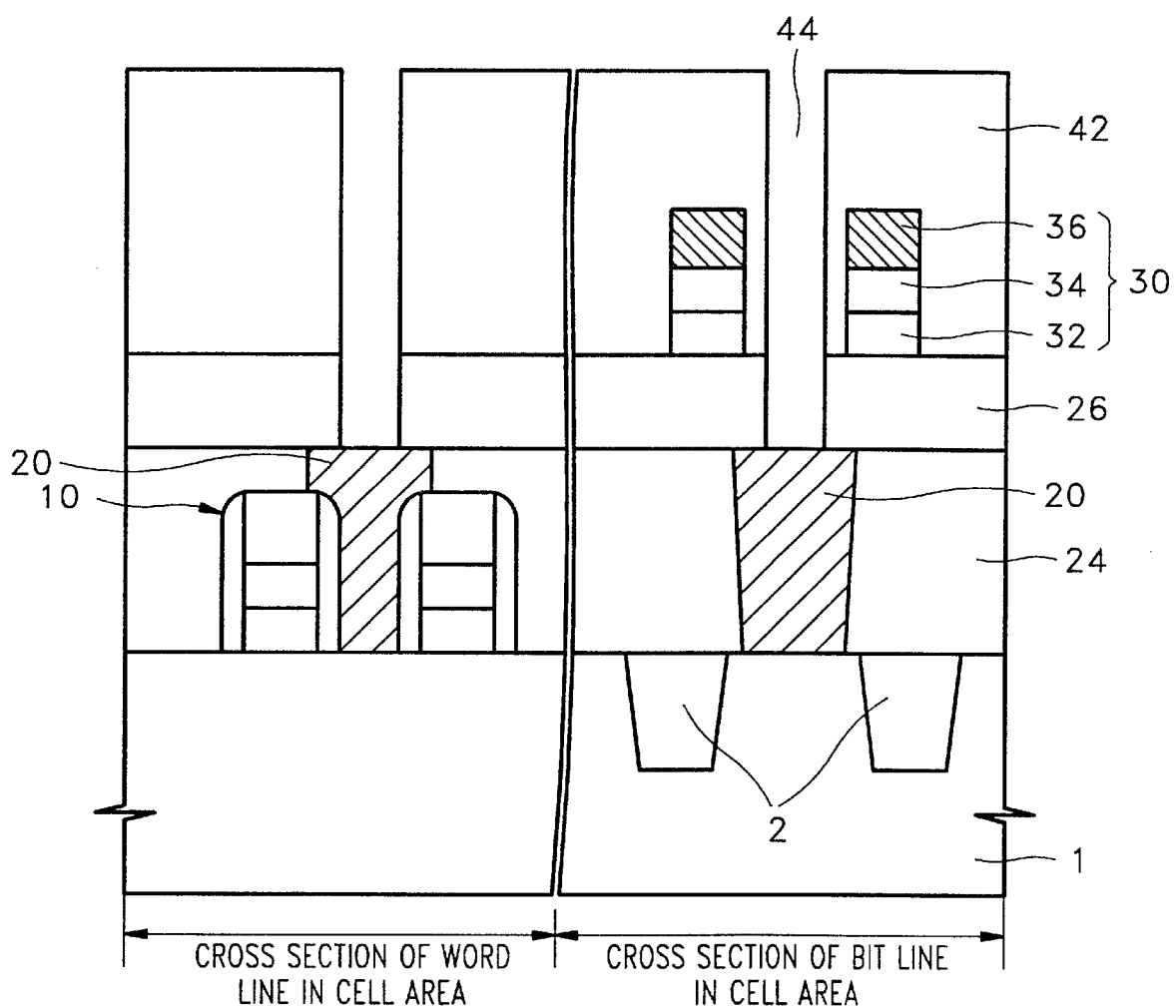
FIG. 5 is a cross sectional view explaining a conventional method of forming a buried contact plug.

FIG. 5 is a cross sectional view for explaining a conventional method of forming a buried contact plug. Referring to FIG. 5, since a capping layer is not used in a bit line pattern 30 composed of a titanium layer 32, a barrier layer 34, and a tungsten layer 36 in the conventional method, a process margin is difficult to secure during a process of etching a buried contact hole 44. Particularly, if any small misalignment occurs in a process of forming the buried contact hole 44, an electrical contact may occur between the bit line pattern 30 and the buried contact hole 44, thus causing a significant defect in the semiconductor device. In FIG. 5, reference numerals 1, 2, 10, 20, 26, and 42 denote a semiconductor substrate, insolation layers, a gate pattern, a buried contact pad, a second interlayer dielectric layer, and a third interlayer dielectric layer, respectively.

Figure 6:
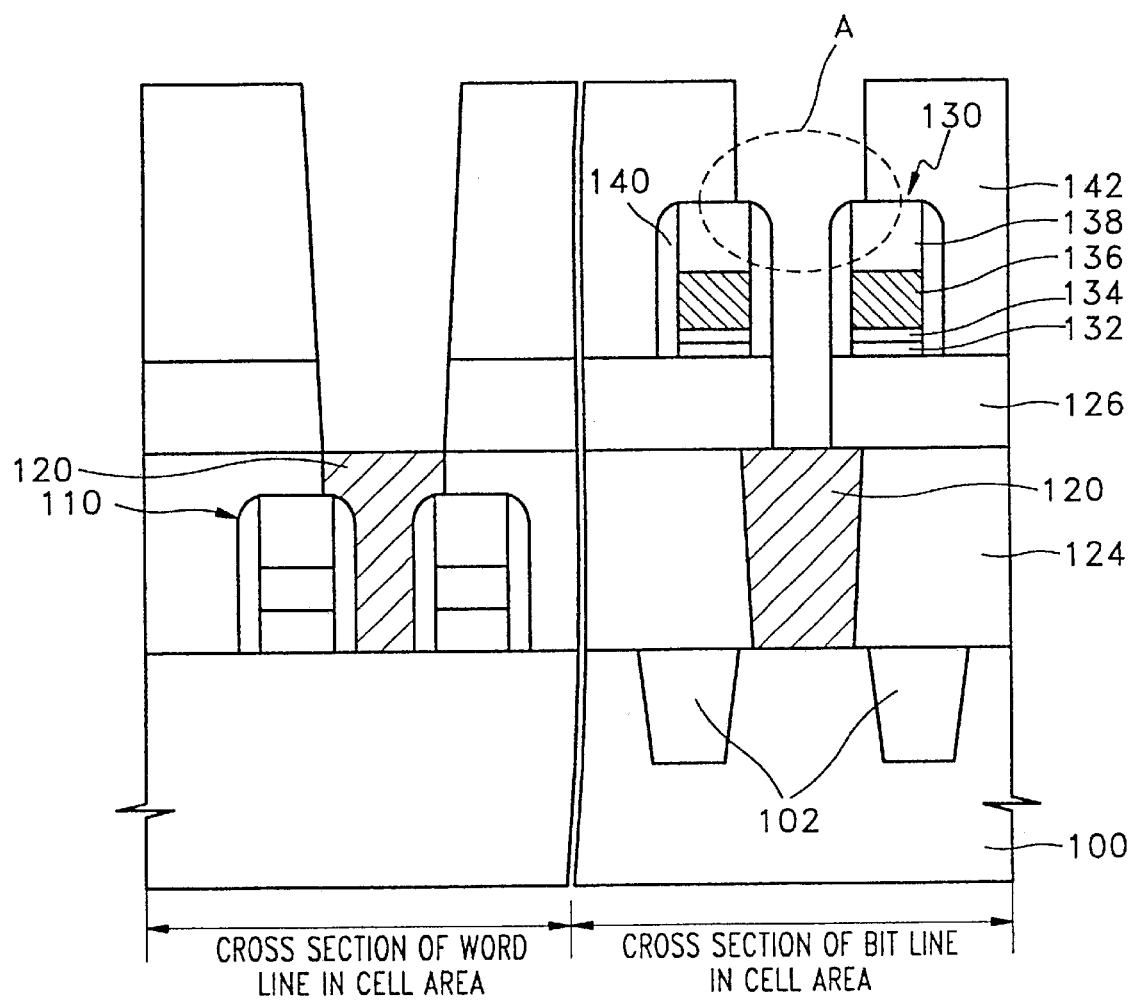
FIGS. 6–15 further illustrate a semiconductor memory device and a fabricating method according to the first embodiment of the present invention.

FIG. 6 is a cross sectional view for explaining a method of forming a buried contact plug according to the present invention. Referring to FIG. 6, capping layers, i.e., a bit line upper insulating layer 138 and a bit line spacer 140 are added to the bit line pattern 130. Thus, since an upper hole size of a buried contact hole is larger than that in the conventional method, the present invention has an advantage in that a buried contact hole having a high aspect ratio can be formed. Furthermore, the capping layers, i.e., the bit line upper insulating layer 138 and bit line spacer 140 are comprised of a nitride layer (denoted by portion A) having high selectivity ratio with respect to the third interlayer dielectric layer 142. Thus, this prevents tungsten, which is a conductive material of the bit line pattern 130, and the buried contact hole from contacting each other, when the buried contact hole is formed by a SAC process.

Figure 7:
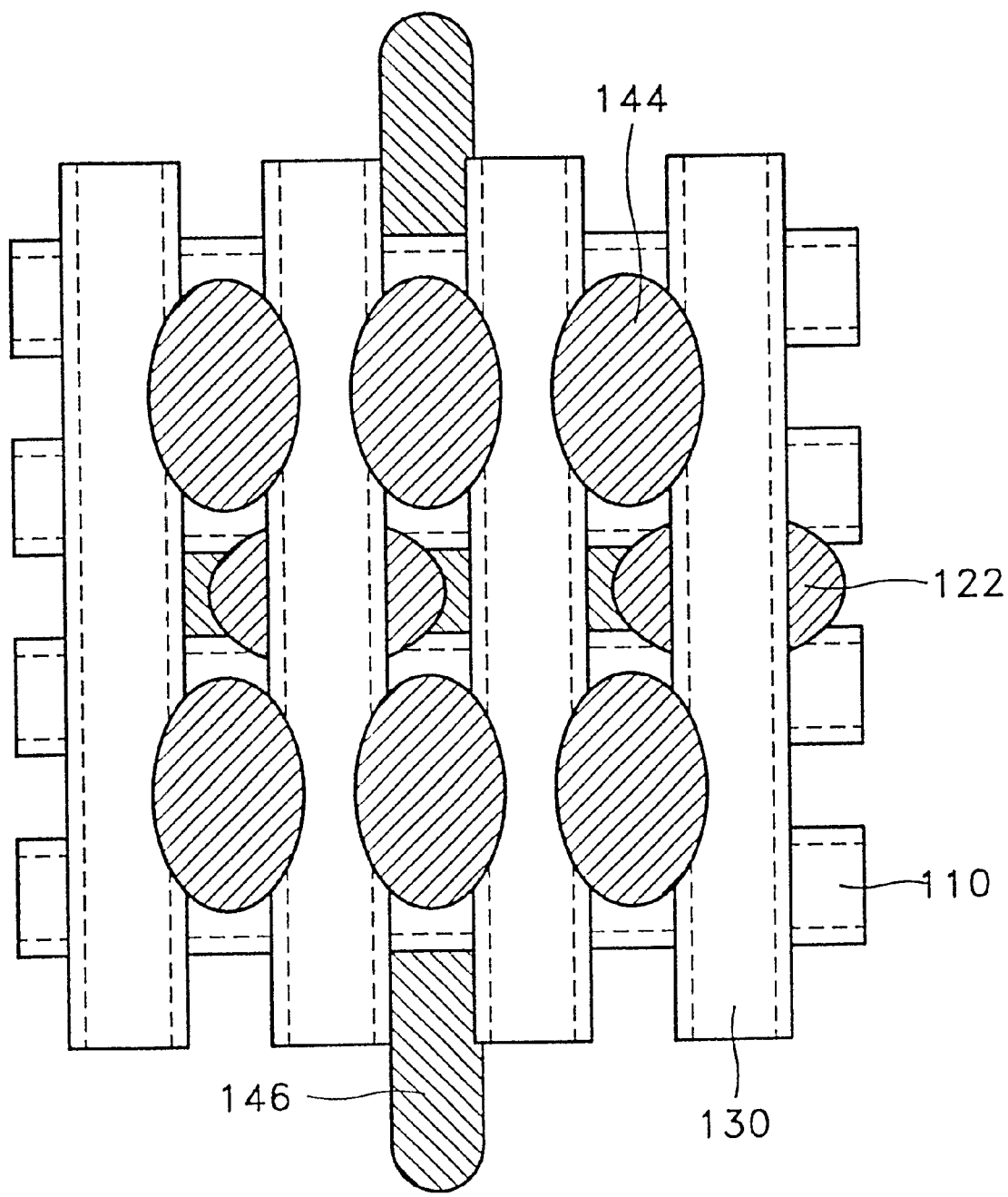

FIG. 7 is a plan view of a cell area on which the buried contact plug has been formed according to the present invention. Referring to FIG. 7, a word line, which is the gate pattern 110, and the bit line pattern 130 cross perpendicularly to each other, and the direct contact pad 122 and the buried contact plug 144, respectively, are formed. Here, as seen from the top view of the cell area, the buried contact plug 144 contacts an active region 146, the bit line pattern 130, and the word line which is the gate pattern 110.

Figure 8:
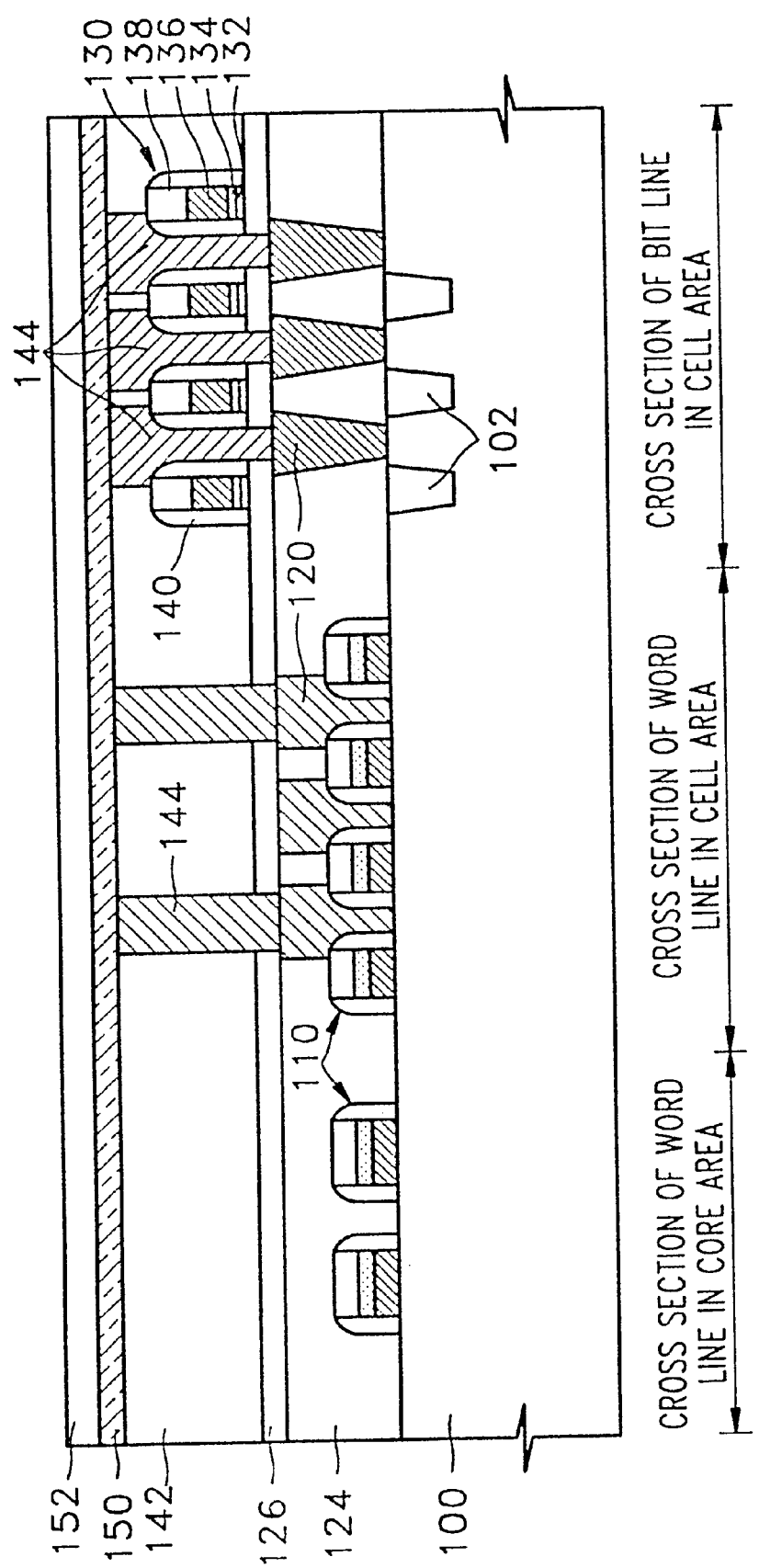

FIG. 8 is a cross sectional view of a semiconductor substrate after an etching stopper and a sacrificial oxide layer are formed on the structure of FIG. 4. Referring to FIG. 8, an etching stopper 150 having a thickness of about 700 Å is formed on the third interlayer dielectric layer 142 through which the buried contact plugs 144 have been formed. Next, a sacrificial oxide layer 152 is formed on the etching stopper 150 to a thickness of 500–2,000 Å, or for example to a thickness of about 1,000 Å. The etching stopper 150 serves to stop etching in a subsequent process for forming the deep inner cylinder capacitor unit denoted by reference numeral 168 of FIG. 12 and in forming a second metal contact hole. Furthermore, the sacrificial oxide layer 152, which is a plasma enhanced-tetraethylorthosilicate (PE-TEOS) layer, serves to prevent the etching stopper 150 from being damaged when planarization is performed for forming a first metal plug (reference numeral 154 of FIG. 9) in a subsequent process.

Figure 9:
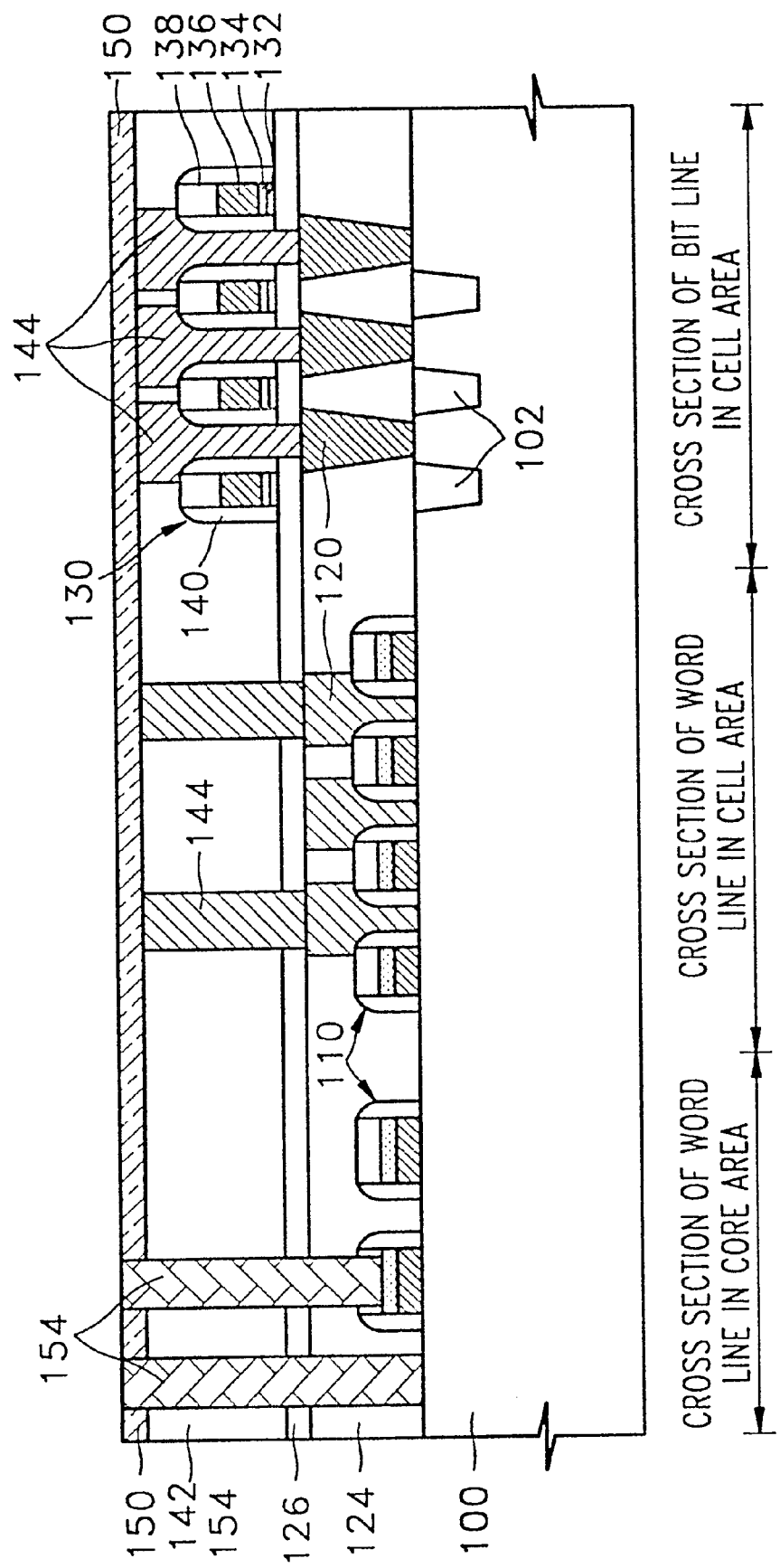

FIG. 9 is a cross sectional view of a semiconductor substrate after a first metal plug is formed in the structure of FIG. 8. Referring to FIG. 9, patterning is performed on the sacrificial oxide layer 152, to form a first metal contact hole that exposes a part of the surface of the semiconductor substrate 100 such as an active region, and the silicide layer 114 of the gate pattern. Thereafter, an ohmic layer (not shown) is formed of titanium silicide (TiSix) at the bottom of the first metal contact hole, in which the active region of the semiconductor substrate 100 is exposed, on which a barrier layer (not shown) is formed of TiN.

Subsequently, a conductive material such as a tungsten layer which overlies the surface of the structure and fills the first metal contact hole is formed, and then the tungsten layer and the sacrificial oxide layer 152 are removed by etchback so that the surface of the etching stopper 150 may be exposed, to form the first metal plug 154. The etchback can be accomplished through a CMP process.

The first metal plug 154 is an essential scheme for forming a deep inner cylinder type capacitor in a subsequent process. In other words, in order to prevent a bridge defect between adjacent storage nodes, which occurs in a typical cylinder stack type capacitor structure, and to suppress other defects caused by a wet strip process for removing the thick fourth interlayer dielectric layer (reference numeral 160 of FIG. 10), the deep inner cylinder type capacitor unit having an improved structure must be adopted.

However, the deep inner cylinder type capacitor unit cannot utilize the outer surface of a polysilicon layer for a lower electrode as a surface area for increasing capacitance. In order to compensate for the reduction in the surface area, a polysilicon layer for a lower electrode having a height of greater than 2 µm has to be formed. Therefore, in a subsequent process, the depth to which a metal contact plug is formed exceeds 3 μm due to the high-structured polysilicon layer for the lower electrode. For this reason, it is significantly difficult to etch a metal contact hole and to form a metal contact plug for filling the metal contact hole, in a semiconductor memory device having a deep inner cylinder type capacitor unit.

The metal contact formation has been solved by forming a metal contact over several times, and in this case, a pad for suppressing misalignment is additionally formed in a region in which a first contact plug is formed during a bit line formation process. However, in the case in which the pad is formed, a core area has to take up more space, thus causing an increase in the core area. This also relatively reduces the cell area, which causes a problem in that many cells have to be formed in a restricted area. Furthermore, if this method is adopted, a metal contact also becomes deeper than the second metal contact hole used in the present invention.

Figure 10:
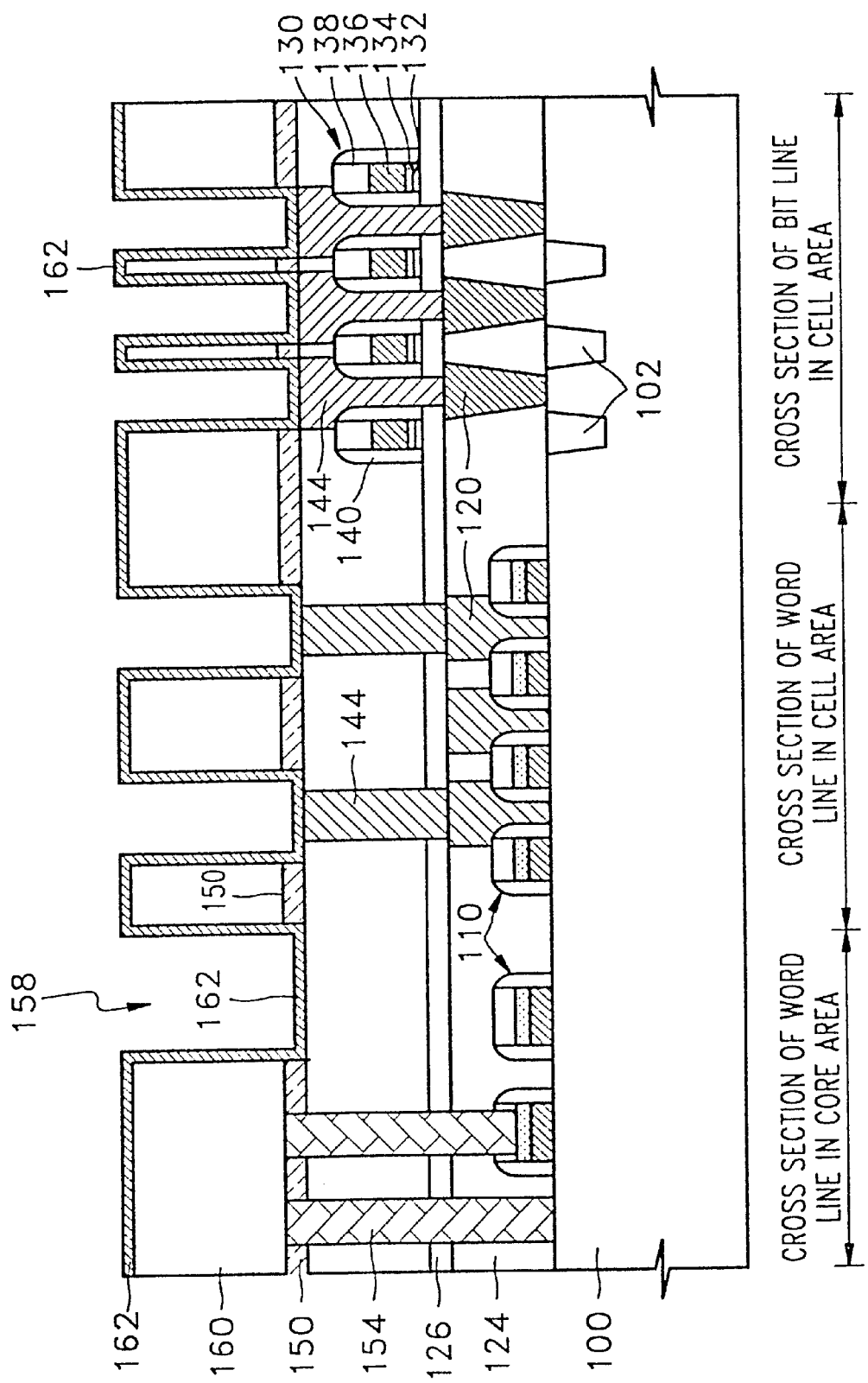

FIG. 10 is a cross sectional view of a semiconductor substrate after a fourth interlayer dielectric pattern and a polysilicon layer for a lower electrode are formed on the structure of FIG. 9. Referring to FIG. 10, a fourth interlayer dielectric layer such as a PE-TEOS layer is formed to a thickness of greater than 1.8 μm on etching stopper 150. Subsequently, the fourth insulating layer is patterned to expose the buried contact plugs 144 in the cell area, and then to form a fourth insulating pattern 160 having a groove 158 that exposes a portion of the third interlayer dielectric layer 142 in the core area. Here, a hole-type pattern exposes the buried contact plugs 144. The groove 158 that exposes a portion of the third interlayer dielectric layer 142 is a structure used for overcoming restrictions of etching selectivity caused by a large step difference in a subsequent process of forming a second metal contact hole. Subsequently, a polysilicon layer 162 for a lower electrode of a capacitor is formed on the surface of the fourth interlayer dielectric pattern 160 having a step difference and the exposed portion of the third interlayer dielectric layer 142, to a predetermined thickness.

Figure 11:
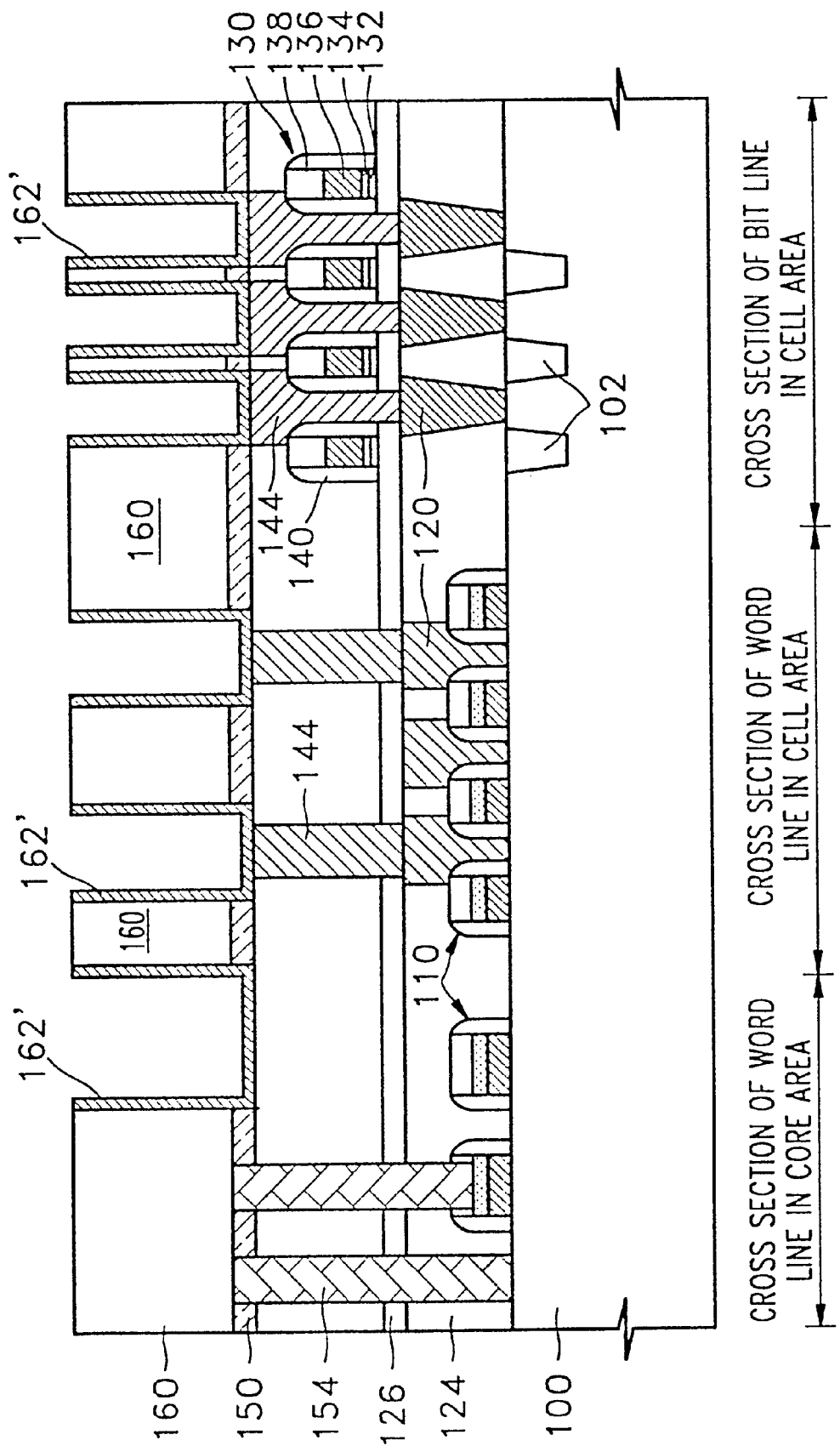

FIG. 11 is sectional view of a semiconductor substrate after the polysilicon layer 162 for a lower electrode is selectively removed from the structure of FIG. 10. Referring to FIG. 10, a photoresist layer (not shown), which fills the groove 158 of the core area and the patterned portion of the cell area, is provided on the polysilicon layer 162 for a lower electrode. Subsequently, etchback is performed on the polysilicon layer 162 for a lower electrode and the photoresist layer to expose the surface of the fourth interlayer dielectric pattern 160, thus forming a separate polysilicon layer 162'. Then, the photoresist layer which fills the groove 158 of the core area and the patterned portion of the cell area is removed from the fourth interlayer dielectric pattern 160, as illustrated in FIG. 11.

Figure 12:
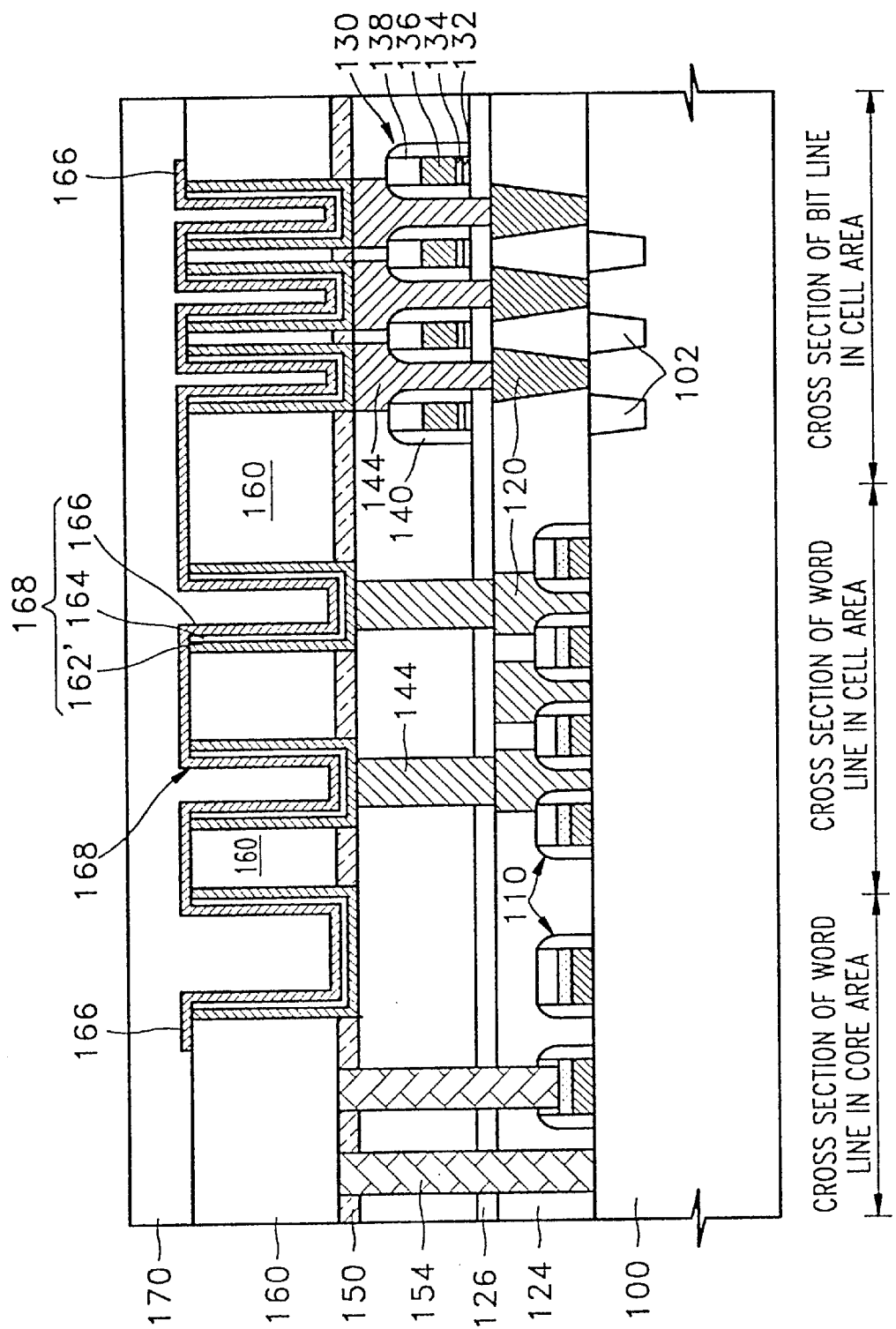

FIG. 12 is a cross sectional view of a semiconductor substrate after a deep inner cylinder type capacitor unit and a fifth interlayer dielectric layer are formed on the structure of FIG. 11. Referring to FIG. 12, a dielectric layer 164 is formed on the polysilicon layer 162'. The dielectric layer 164 may be formed of one selected from $Ta_2O_5$, $Al_2O_3$ formed by deposition of an atomic layer, or a bilayer of nitride and oxide layers. In this case, in order to increase the surface area of the polysilicon layer 162' for a lower electrode before the dielectric layer 164 is formed, a process of forming hemispherical grains (HSG) can further be performed. Next, an upper electrode layer 166 is formed over the structure on which the dielectric layer 164 has been formed, to form a deep inner cylinder type capacitor unit 168. The upper electrode layer 166 may be formed using a bilayer of TiN and a polysilicon layer.

Since the interlayer dielectric layer for forming a cylinder type capacitor (the fourth interlayer dielectric layer of the present invention) is not removed in the deep inner cylinder type capacitor unit 168, only the inner surface of the polysilicon layer 162' for a lower electrode is utilized as the area of a lower electrode contacting the dielectric layer 164. In order to compensate for the reduction in the surface area of the lower electrode in the deep inner cylinder type capacitor unit 168, the polysilicon layer 162' for a lower electrode may be formed to a height of greater than 2 μm. Next, a fifth interlayer dielectric layer 170 of PE-TEOS is deposited over the structure on which the deep inner cylinder type capacitor unit 168 has been formed.

A method of forming the deep inner cylinder type capacitor unit 168 without removal of the fourth interlayer dielectric pattern 160 according to the present invention, does not require a process of removing the thick fourth interlayer dielectric pattern by a wet strip. Thus, this method can prevent many process defects that may occur in a wet strip process. Furthermore, since the step difference between the cell area and core area can be reduced, a global planarization process for reducing a height difference between the cell area and the core area is not required. As a result, fabrication can be simplified.

FIG. 13 is a cross sectional view of a semiconductor substrate after a second metal plug and a metal wiring pattern are formed in the structure of FIG. 12. Referring to FIG. 13, after a photoresist pattern is formed on the fifth interlayer dielectric layer 170, patterning is performed to form a second metal contact hole that exposes the first metal plug 154 and a contact hole for wiring that exposes the upper electrode layer 166 of the capacitor in the groove 158 of the core area. In this case, the diameter of the second metal contact hole is preferably larger than that of the first metal contact hole.

An adhesion layer (not shown) is formed at the bottom of the second metal contact hole, using titanium (Ti). Subsequently, after a tungsten layer for filling the second metal contact hole and the contact hole for wiring is deposited over the structure 100 to a sufficient thickness, etchback or CMP is performed to form second metal plugs 172 for filling the second metal hole and the contact plug for wiring 174. Next, after a metal wiring layer is stacked on the structure on which the second metal plug 172 and the contact plug for wiring 174 have been formed, a photolithography process is performed to form a metal wiring pattern 176 for connecting the second metal plug 172 and the contact plug for wiring 174.

Figure 14:
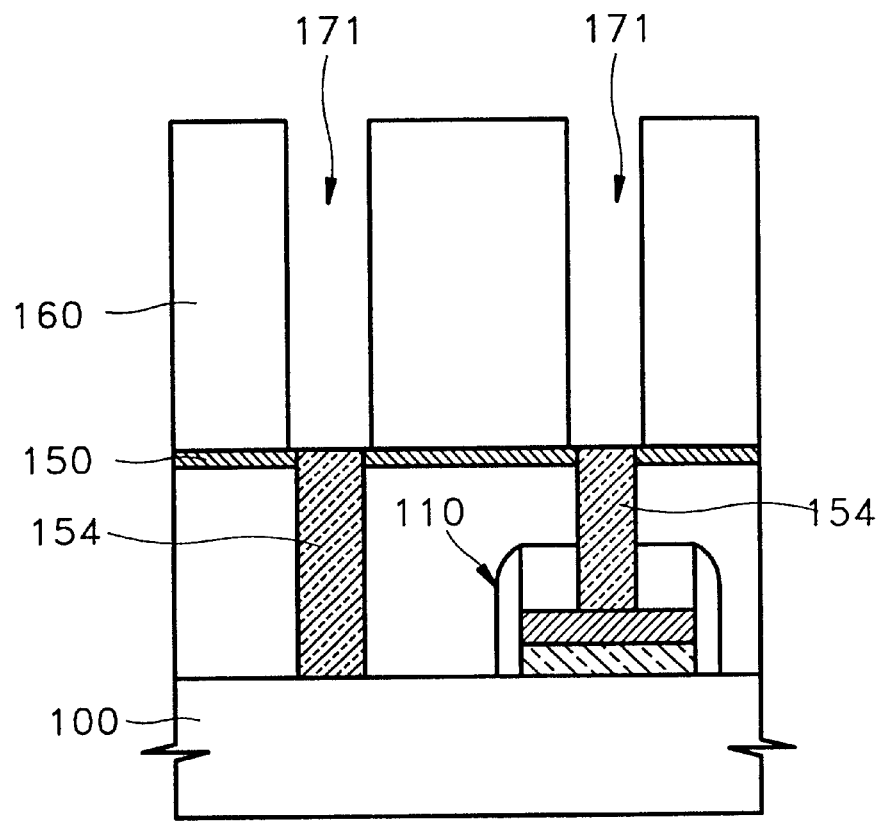
Figure 15:
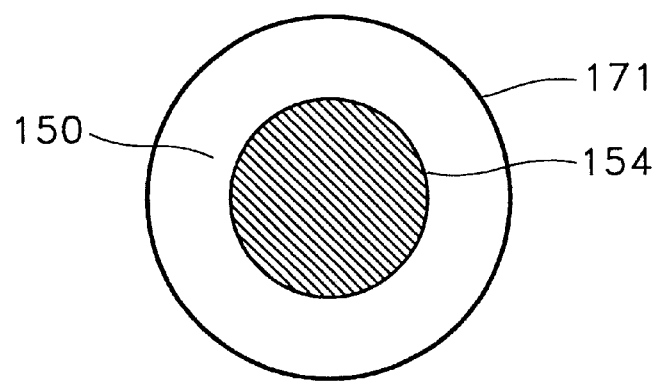

FIG. 14 is a cross sectional view of a structure after a second metal layer has been etched as in of FIG. 13, and FIG. 15 is a plan view showing that the first metal plug and the second metal contact hole of FIG. 14 overlap each other. Referring to FIGS. 14 and 15, if the diameters of the first metal plug 154 and a second metal contact hole 171 are 350 nm and 420 nm, respectively, an overlap of the first metal plug 154 and the second metal contact hole 171 enables borderless contact etching due to a difference in diameter between the first metal plug 154 and the second metal contact hole 171, and the function of the etching stopper using a nitride layer. Thus, this borderless contact etching is advantageous in forming and filling of the second metal contact hole 171 having a high aspect ratio, which is a prerequisite for forming the deep inner cylinder type capacitor unit 168.

Figure 16:
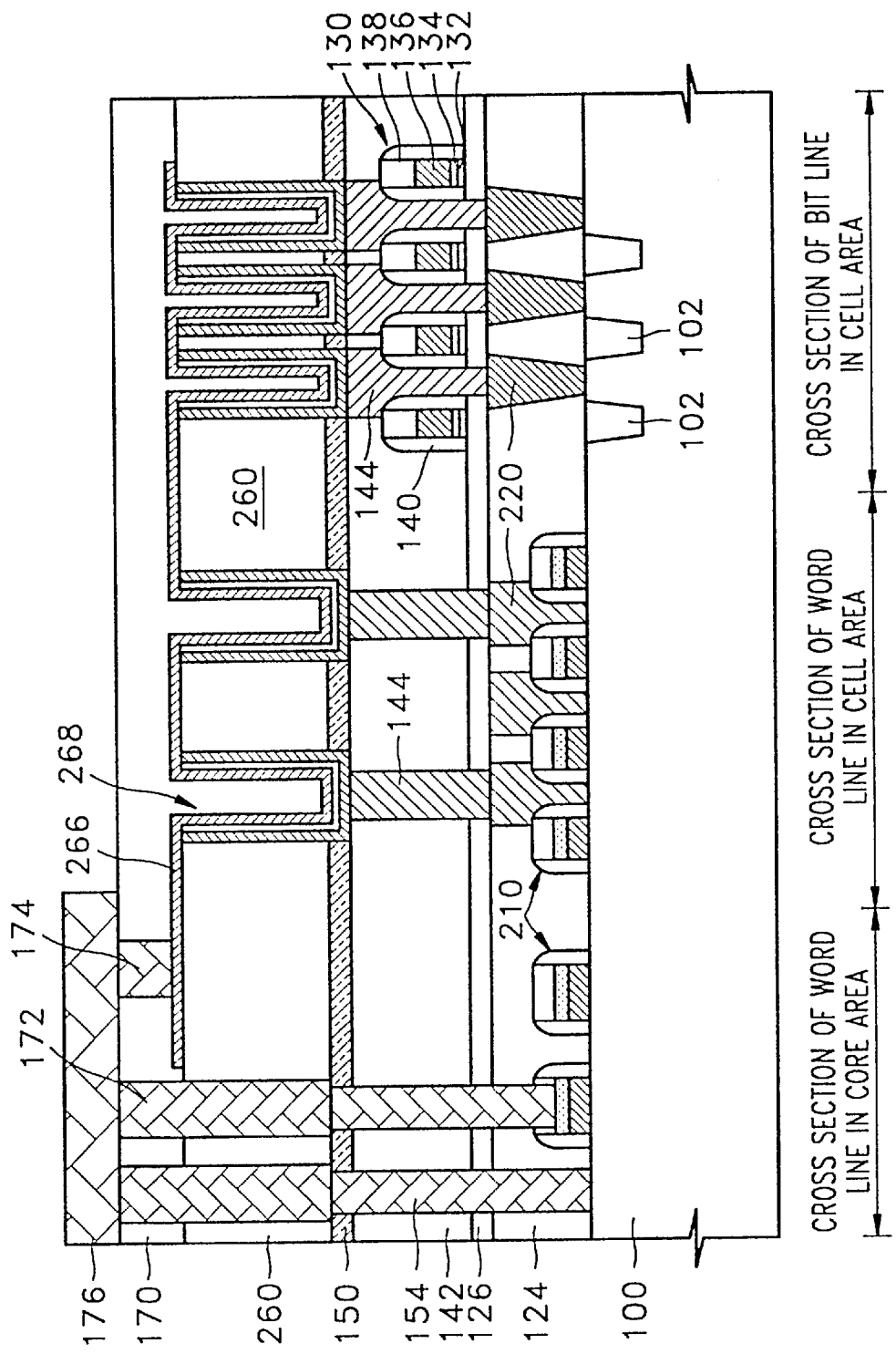
FIG. 16 is a cross sectional view for explaining a semiconductor device and a fabricating method thereof according to a second embodiment of the present invention.

FIG. 16 is a cross sectional view for explaining a semiconductor memory device and a fabricating method thereof according to a second embodiment of the present invention. In the first embodiment, after the groove (reference numeral 158 of FIG. 10) is formed in the core area, the contact plug for wiring 174 is formed by stacking the overlying upper electrode layer 166. However, referring to FIG.16, in a method of fabricating a semiconductor memory device according to a second embodiment of the present invention, the contact plug for wiring 174 is formed without forming a groove in a fourth interlayer dielectric pattern 260 in the core area. Other manufacturing processes are omitted since the processes are the same as those in the first embodiment.

Furthermore, the structure of a semiconductor memory device according to the second embodiment of the present invention is the same as that of the semiconductor memory device in the first embodiment, except that a groove is not formed in the fourth interlayer dielectric pattern 260, that the fourth interlayer dielectric pattern 260 covers the entire core area, and that the contact plug for wiring 174 is not formed in a groove, but is directly formed on the fourth interlayer dielectric pattern 260.

In summary, according to the present invention, firstly, a process margin between a bit line pattern and a buried contact hole is secured by forming the buried contact hole by a SAC process using capping layers of the bit line pattern. Secondly, the present invention facilitates formation of a deep inner cylinder type capacitor, thus preventing a bridge defect between nodes and suppressing the occurrence of particles, while simplifying fabrication. Thirdly, since a second metal contact hole is of a larger diameter compared with the underlying first metal contact hole, the second metal contact hole having a deep structure can be appropriately etched and then filled with a conductive material.

The invention being thus described, it will be obvious that the same may be varied in many ways. Such variation are not to be regarded as a departure from the spirit and scope of the invention, and all such modifications as would be obvious to one skilled in the art are intended to be included within the scope of the following claims.

What is claimed is:

1. A method of manufacturing a semiconductor memory device including a core area and a cell area, comprising:
    forming a gate pattern having capping layers on a semiconductor substrate, the semiconductor substrate having an isolation layer formed therein;
    forming a first interlayer dielectric layer on the semiconductor substrate and the gate pattern, and patterning the first interlayer dielectric layer to include a direct contact pad and a buried contact pad;
    forming a second interlayer dielectric layer on the patterned first interlayer dielectric layer, and forming a bit line pattern having capping layers in the cell area;
    forming a third interlayer dielectric layer on the second interlayer dielectric layer and the bit line pattern, forming a buried contact hole through to the buried contact pad in the cell area by a self aligned contact process, and forming a buried contact plug for filling the buried contact hole;
    forming an etching stopper on the third interlayer dielectric layer including the buried contact plug, forming a first metal contact hole in the core area, and forming a first metal plug for filling the first metal contact hole;
    forming a fourth interlayer dielectric layer on the etching stopper and the first metal plug, and then patterning the fourth interlayer dielectric layer to form a fourth interlayer dielectric pattern having a groove which exposes the buried contact plug in the cell area and which exposes a surface of the third interlayer dielectric layer in the core area;
    forming a polysilicon layer on the fourth interlayer dielectric layer and in the groove, and then selectively removing the polysilicon layer to form a lower electrode along a step difference within the groove;
    forming a dielectric layer on the lower electrode;
    forming an upper electrode pattern on the fourth interlayer dielectric layer and the dielectric layer, so that an upper electrode layer of the core area and an upper electrode layer of the cell area are connected together;
    stacking a fifth interlayer dielectric layer on the on the fourth interlayer dielectric layer and the upper electrode pattern, and then forming a first contact hole for wiring that exposes the upper electrode layer in the groove in the core area and a second metal contact hole that exposes the first metal plug; and
    forming a contact plug for wiring that fills the first contact hole and a second metal plug that fills the second metal contact hole.

2. The method of claim 1, wherein the isolation layer is formed by a shallow trench isolation process.

3. The method of claim 1, wherein the bit line pattern is formed by stacking of a titanium layer, a barrier layer, and a tungsten layer on the second interlayer dielectric layer.

4. The method of claim 3, wherein the capping layers of the gate pattern and the bit line pattern include insulating nitride layers formed on tops of the gate pattern and the bit line pattern, and spacers of nitride layers formed along sidewalls of the gate pattern and the bit line pattern.

5. The method of claim 4, wherein, the capping layers of the bit line pattern comprise nitride layers formed by a plasma enhanced chemical vapor deposition (PECVD) technique at a temperature of 200–400° C., to prevent lifting of the tungsten layer.

6. The method of claim 1, wherein said forming a buried contact plug in the buried contact hole comprises:
    depositing polysilicon which overlies the third interlayer dielectric layer and fills the buried contact hole; and
    performing etchback of the polysilicon so that a surface of the third interlayer dielectric layer may be exposed.

7. The method of claim 1, wherein the etching stopper is a nitride layer.

8. The method of claim 1, wherein said forming an etching stopper further comprises forming a sacrificial oxide layer on the etching stopper.

9. The method of claim 8, wherein the sacrificial oxide layer is formed to a thickness of 500–2,000 Å using plasma enhanced-tetraethylorthosilicate (PE-TEOS).

10. The method of claim 1, wherein said forming a first metal plug comprises:
    forming an ohmic layer and a barrier layer in the first metal contact hole on a boundary contacting an active region of the semiconductor substrate; and
    forming a tungsten layer on the barrier layer.

11. The method of claim 1, wherein the first metal plug contacts an active region of the semiconductor substrate, the bit line pattern, and a word line.

12. The method of claim 1, wherein the fourth interlayer dielectric layer is formed to a thickness of greater than 1.8 μm using PE-TEOS.

13. The method of claim 1, wherein said selectively removing the polysilicon layer comprises:
    coating a photoresist layer which overlies the polysilicon layer;

performing etchback on the photoresist layer to expose a surface of the fourth interlayer dielectric layer; and removing the photoresist layer from the groove formed in the fourth interlayer dielectric layer.

14. The method of claim 1, wherein said selectively removing the polysilicon layer further comprises the step of forming hemispherical grains (HSGs) on the polysilicon layer.

15. The method of claim 1, wherein the dielectric layer is selected from dielectric materials consisting of $Ta_2O_5$, $Al_2O_3$ formed by atomic deposition, and a bilayer of nitride and oxide layers.

16. The method of claim 1, wherein the upper electrode layer is formed of a bilayer of titanum nitride (TiN) and a polysilicon layer.

17. The method of claim 1, wherein a diameter of the second metal plug is larger than a diameter of the first metal plug, and a borderless contact is formed using the etching stopper overlying the first metal plug.

18. The method of claim 1, wherein after forming a second metal contact hole, further comprising forming an adhesion layer at the bottom of the second metal contact hole using titanium and titanium nitride.

19. A semiconductor memory device including a core area and a cell area, comprising:

a semiconductor substrate including an isolation layer formed by shallow trench isolation;

a gate pattern formed on the semiconductor substrate, the gate pattern having capping layers formed thereon;

a bit line pattern having capping layers formed at sidewalls and tops thereof, the bit line pattern and the gate pattern having first and second interlayer dielectric layers therebetween;

a buried contact plug that fills a buried contact hole formed through a third interlayer dielectric layer by a self-aligned contact process, using the capping layers of the bit line pattern in the cell area, the third interlayer dielectric layer being formed on the bit line pattern and the second interlayer dielectric layer;

an etching stopper provided over the third interlayer dielectric layer and the buried contact plug;

a first metal plug connected to a surface of the semiconductor substrate and the gate pattern, by patterning the etching stopper and the first, second, and third interlayer dielectric layers in the core area;

a fourth interlayer dielectric pattern provided over the etching stopper and the first metal plug, which exposes the buried contact plug in the cell area and has a groove exposing a portion of the third interlayer dielectric layer in the core area;

a deep inner cylinder type capacitor formed along a step difference of the fourth interlayer dielectric layer and on a surface of the third interlayer dielectric layer exposed through the fourth interlayer dielectric pattern;

a second metal plug which is connected to the first metal plug and which has a diameter larger than a diameter of the first metal plug, the second metal plug being formed in a fifth interlayer dielectric layer in the core area, the fifth interlayer dielectric layer being formed on the fourth interlayer dielectric layer and the deep inner cylinder type capacitor; and a contact plug for wiring which is connected to an upper electrode layer of the deep inner cylinder type capacitor in the groove formed in the fourth interlayer dielectric pattern.

20. A method of fabricating a semiconductor memory device including a core area and a cell area, comprising:

forming a gate pattern including capping layers on a semiconductor substrate, the semiconductor substrate having an isolation separation layer formed therein;

forming a first interlayer dielectric layer on the semiconductor substrate and the gate pattern, and patterning the first interlayer dielectric layer to include a direct contact pad and a buried contact pad;

forming a second interlayer dielectric layer on the patterned first interlayer dielectric layer, and forming a bit line pattern having capping layers in the cell area;

forming a third interlayer dielectric layer on the second interlayer dielectric layer and the bit line pattern, forming a buried contact hole through to the buried contact pad by a self aligned contact process in the cell area, and forming a buried contact plug for filling the buried contact hole;

forming an etching stopper on the third interlayer dielectric layer including the buried contact plug, forming a first metal contact hole in the core area, and forming a first metal plug for filling the first metal contact hole;

forming a fourth interlayer dielectric pattern on the etching stopper and the first metal plug, which exposes the buried contact plug in the cell area and which overlies an entire surface of the core area;

forming a polysilicon layer on the fourth interlayer dielectric pattern and the buried contact plug in the cell area, and then selectively removing the polysilicon layer to form a lower electrode along a step difference of the fourth interlayer dielectric pattern;

forming a dielectric layer on the lower electrode;

forming an upper electrode pattern on the fourth interlayer dielectric pattern and the dielectric layer which is connected and which is in the cell area and extends to a portion of the core area;

stacking a fifth interlayer dielectric layer on the fourth interlayer dielectric layer and the upper electrode pattern, and then forming a first contact hole for wiring that exposes a portion of the upper electrode pattern extending to the core area and a second metal contact hole that exposes the first metal plug; and forming a contact plug for wiring that fills the first the contact hole and a second metal plug that fills the second metal contact hole.

21. A semiconductor memory device including a core area and a cell area, comprising:

a semiconductor substrate including an isolation layer formed by shallow trench isolation;

a gate pattern formed on the semiconductor substrate, the gate pattern including capping layers formed thereon;

a bit line pattern including capping layers, the bit line pattern and the gate pattern having first and second interlayer dielectric layers therebetween;

a buried contact plug that fills a buried contact hole formed through a third interlayer dielectric layer by a self-aligned contact process, using the capping layers of the bit line pattern in the cell area, the third interlayer dielectric layer being formed on the bit line pattern and the second interlayer dielectric layer;

an etching stopper provided over the third interlayer dielectric layer and the buried contact plug;

a first metal plug connected to a surface of the semiconductor substrate and the gate pattern, by patterning the etching stopper and the first, second, and third interlayer dielectric layers in the core area;

a fourth interlayer dielectric pattern which is provided over the etching stopper and the first metal plug, which exposes the buried contact plug in the cell area;

a deep inner cylinder type capacitor formed along a step difference of the fourth interlayer dielectric pattern and on a surface of the third interlayer dielectric layer exposed by the fourth interlayer dielectric pattern;

a second metal plug which is connected to the first metal plug and which has a diameter larger than a diameter of the first metal plug, the second metal plug being formed in a fifth interlayer dielectric layer in the core area, the fifth interlayer dielectric layer being formed on the fourth interlayer dielectric layer and the deep inner cylinder type capacitor; and a contact hole for wiring which is connected to an upper electrode layer of the deep inner cylinder type capacitor through the fifth interlayer dielectric layer in the core area.

* * * * *